United States Patent
Kher et al.

(12)

(10) Patent No.: US 6,721,276 B1
(45) Date of Patent: Apr. 13, 2004

(54) AUTOMATED MICROCODE TEST PACKET GENERATION ENGINE

(75) Inventors: Minesh R. Kher, Billerica, MA (US); Alejandro Simoes, Boston, MA (US)

(73) Assignee: Cisco Technology, Inc., San Jose, CA (US)

( * ) Notice: Subject to any disclaimer, the term of this patent is extended or adjusted under 35 U.S.C. 154(b) by 637 days.

(21) Appl. No.: 09/607,161

(22) Filed: Jun. 29, 2000

(51) Int. Cl.[7] ............................................. G06F 11/00
(52) U.S. Cl. ......................... 370/242; 714/25; 714/738
(58) Field of Search .............................. 370/241, 242, 370/243–245, 246–251; 714/25, 30, 738, 703, 712, 715, 733, 734, 799

(56) References Cited

U.S. PATENT DOCUMENTS

| | | | |
|---|---|---|---|
| 4,745,593 A | * 5/1988 | Stewart | 370/244 |
| 5,677,913 A | 10/1997 | Aybay | 371/21.3 |
| 5,719,880 A | 2/1998 | Leung | 371/22.5 |
| 5,751,729 A | 5/1998 | Aybay | 371/21.1 |
| 6,134,690 A | * 10/2000 | Ivaturi et al. | 714/736 |
| 6,167,479 A | 12/2000 | Harnet et al. | 710/260 |
| 6,237,054 B1 | * 5/2001 | Freitag, Jr. | 710/72 |
| 6,373,822 B1 | * 4/2002 | Raj et al. | 370/252 |

* cited by examiner

Primary Examiner—Dang Ton
Assistant Examiner—Tri H. Phan
(74) Attorney, Agent, or Firm—Hamilton, Brook, Smith & Reynolds, P.C.

(57) ABSTRACT

A routing chip test case generator operable to generate test cases for testing microcode allows test cases to be directed to specific operations, such as those executed by an Application Specific Integrated Circuit (ASIC), without burdening the test cases with other operations performed during packet traffic routing in a routing engine. Such test cases are directed to specific microcode operations to be tested by simulating the other traffic processing operations performed during packet routing. A router packet is generated to simulate message traffic in a routing engine. The router packet is modified to produce a router test packet that emulates the packet at a point prior to the specific microcode instructions to be tested. A test verification packet is generated to simulate the router test packet after the specific microcode instructions to be tested are applied to the router test packet. The specific microcode instructions are applied to the router test packet to produce a test results packet, and compared to the test verification packet. In this manner, ASICs directed to specific microcode operations can be discretely tested without encompassing or anticipating other packet routing operations which typically occur as a packet is processed by the routing engine.

33 Claims, 4 Drawing Sheets

AUTOMATED MICROCODE TEST PACKET GENERATION ENGINE

BACKGROUND OF THE INVENTION

Systems and methods are known for testing routing engines which perform message traffic routing in a computer network. Typically, a router packet is generated to target a specific traffic processing operation performed by a hardware, software, or firmware unit under test. An expected output packet is also generated to correspond to the state of the router packet after the specific traffic processing operation has been performed. The expected output packet is then compared to the actual output packet received from the routing engine to determine the success or failure of the test. By generating a series of router packets and corresponding expected output packets, a range of test cases covering the desired traffic processing operations to be tested is produced to fully test the routing engine.

In a routing engine, input packets are received, processed, and then sent on as output packets. Various traffic processing operations may add to, delete from, or otherwise modify the router packet, typically according to a protocol such as the Transmission Control Protocol/Internet Protocol (TCP/IP). In the routing engine, one or more routing chips apply traffic routing instructions to the packet in series according to the traffic processing operations to be performed. Each traffic processing operation includes one or more traffic routing instructions. During a traffic processing operation, many traffic routing instructions may be applied to and may modify the router packet.

When a test case is generated, the expected output packet is generated to correspond to the modifications the router engine will apply to the router packet. The expected output packet reflects the modifications that will be made by the traffic processing operation that the test case is directed to. Each router packet, however, is processed according to a full series of traffic routing instructions occurring as the input packet is processed into an output packet. Therefore, each test case must anticipate not only the modification made by the traffic routing instructions that the test case is directed to, but to all the traffic routing instructions which will modify the packet from the packet through processing as an input packet to the output packet.

Some traffic routing instructions, such as those driven by microcode residing in Application Specific Integrated Circuits (ASICs), result in an unwieldy number of test cases due to the a complex arrangement of control paths exhibited by the traffic routing instructions to be tested. The router packet and the expected output packet must nonetheless be generated to anticipate not only the traffic routing instructions applied by the microcode, but also other traffic routing instructions such as those driven by TCP/IP and other protocols employed by the router engine. The effort required to generate and analyze all the packets of the test cases which result from microcode is substantial. Accordingly, it would be beneficial to provide a system and method to generate router packets directed to test only a set of instructions corresponding to microcode residing in ASICs, without the need to generate router packets and expected output packets which anticipate other traffic routing instructions occurring in the router engine.

SUMMARY OF THE INVENTION

A routing chip test case generation system and analyzer operable to generate and analyze test cases for testing microcode allows test cases to be directed to specific microcode operations, such as those executed by an Application Specific Integrated Circuit (ASIC), without burdening the test cases with other operations performed during packet traffic routing in a routing engine. Such ASIC-based test cases are directed to specific microcode operations to be tested by simulating the other non-microcode traffic processing operations performed during packet routing. A router packet is generated to simulate message traffic in a routing engine. The router packet is modified to produce a router test packet that emulates the state of the packet at a point prior to the specific microcode instructions to be tested. A test verification packet is generated to simulate the router test packet after the specific microcode instructions to be tested are applied to the router test packet. The specific microcode instructions are applied to the router test packet to produce a test results packet, and compared to the test verification packet. In this manner, ASICs directed to specific microcode operations can be discretely tested without encompassing or anticipating other traffic routing instructions which typically occur as a packet is processed by the routing engine.

In this manner, the test case generation system generates a router packet directed to testing a specific traffic processing operation in the routing engine. The test case generator determines the processing operations that modify the packet in the routing engine just prior to the execution of the set of test instructions, generates a router test packet indicative of the processing operations prior to the set of test instructions being applied to the router packet, and generates a test verification packet indicative of the set of test instructions being applied to the router test packet.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of particular embodiments follows.

Figure 1:
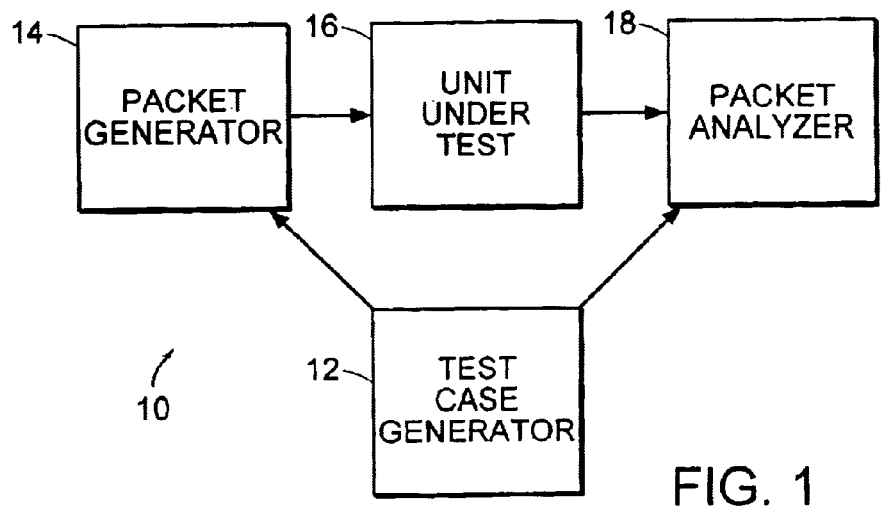
FIG. 1 is a block diagram of the automated test case generation system as defined herein.

FIG. 1 shows a block diagram of the automated test case generation system 10 operable for performing packet-based testing as defined herein. Referring to FIG. 1, a test case generator 12 generates test cases indicative of a router test packet and a test verification packet. The packet generator 14 generates the router test packet and sends the router test packet to the unit under test 16. The packet analyzer 18 generates the test verification packet corresponding to the test case. The unit under test 16 applies a set of test instructions corresponding to the traffic processing operation to which the test case is directed to generate a test results packet. The test results packet is sent to the packet analyzer 18, where it is compared with the test verification packet. In this manner, the unit under test, such as an ASIC or other router chip, can be tested by generating a router test packet and test verification packet corresponding only to the traffic processing operations to be tested. Further, such testing may be performed on a simulator designed to simulate the actual operations to be performed by the unit under test, rather than the actual hardware, software, or firmware.

Figure 2:
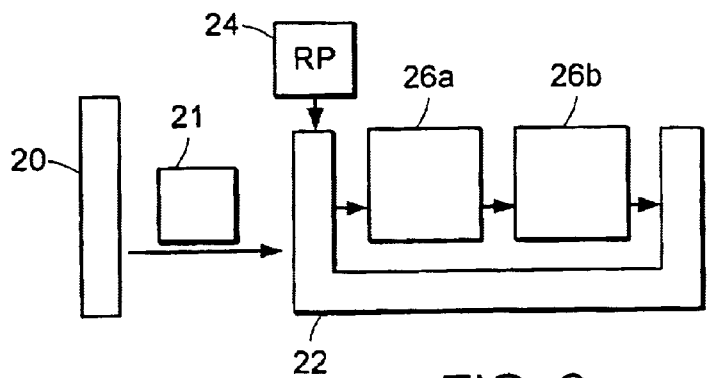
FIG. 2 shows a prior art packet-based test system.

FIG. 2 shows a prior art packet-based test apparatus. A line card 20 or simulator provides a router packet 21 to a routing engine 22. The routing engine 22 processes the router packet according to processing operations from a router processor 24. The message is then sent to two groups of ASIC processor banks 26a and 26b, respectively. The router packet 21 directed to testing a traffic processing operation in the processor banks 26a and 26b, therefore, must anticipate the processing operations to be performed by the router processor 24. Accordingly, the router packet 21 and the corresponding expected result packet must be generated with information corresponding to the processing operations to be performed by the router processor 24, in addition to the processing operations to be performed by the processor banks 26a and 26b under test.

Figure 3:
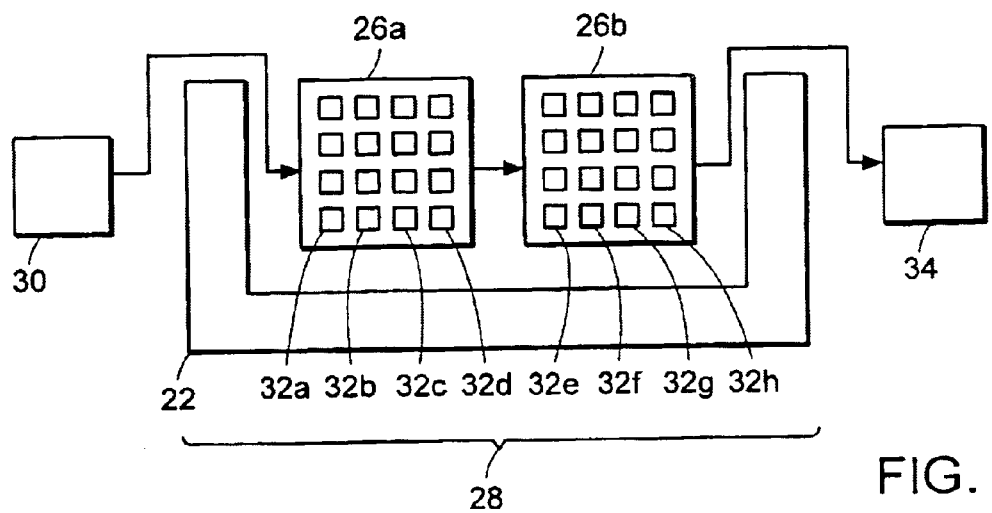
FIG. 3 shows the test case generation system being used for microcode testing as defined herein.

FIG. 3 shows a particular embodiment of the system operable to use the test case generator for testing microcode as defined herein. A test bed 28 includes the routing engine 22 and the processor banks 26a and 26b. In a particular embodiment, each processor bank includes a 4*4 array of processors. These processors are arranged in eight columns, comprising eight processor groups defined by processor columns 32a–32h. Each of the processor columns 32a–32h is directed to a particular type of traffic processing operations, such as routing table lookup, quality of service (QOS), IP sanity check, access lists, multicasting, and others. A router test packet 30 is generated to test a set of instructions corresponding to a traffic processing operation to be tested, as will be described further below. The router test packet 30 is sent directly to the processor banks 26a and 26b, and is processed in sequence by each of the processor columns 32a–32h. The router test packet 30 is not processed by the router processor 24 (FIG. 2), so the router test packet 30 does not need to contain fields corresponding to operations performed by the router processor 24 (FIG. 2). A particular router test packet 30 is typically directed to a traffic processing operation to be performed by one of the processor columns 32a–32h. A router test packet, however, can be directed to multiple processor columns 32a–32h. Following processing by each of the processor columns, 32a–32h, the output packet 34 is generated.

Prior to discussing the test bed 28 in conjunction with the test case generator 12, a further discussion of prior art microcode testing may be beneficial. As indicated above with respect to FIG. 2, the routing engine 22 receives a router packet 21 from the line card 20. In a testing environment, a traffic generation module (TGM), described further below, is used to generate packets to emulate router packets from a line card 20. Since the TGM generates complete router packets, router processor 24 operations, as well as processor bank 26a and 26b operations, are anticipated. Since the TGM generates all fields in a router packet 21, it can be beneficial to modify the TGM generated router packet 21 to generate a router test packet 30 which does not include information directed to the router processor 24.

Figure 4:
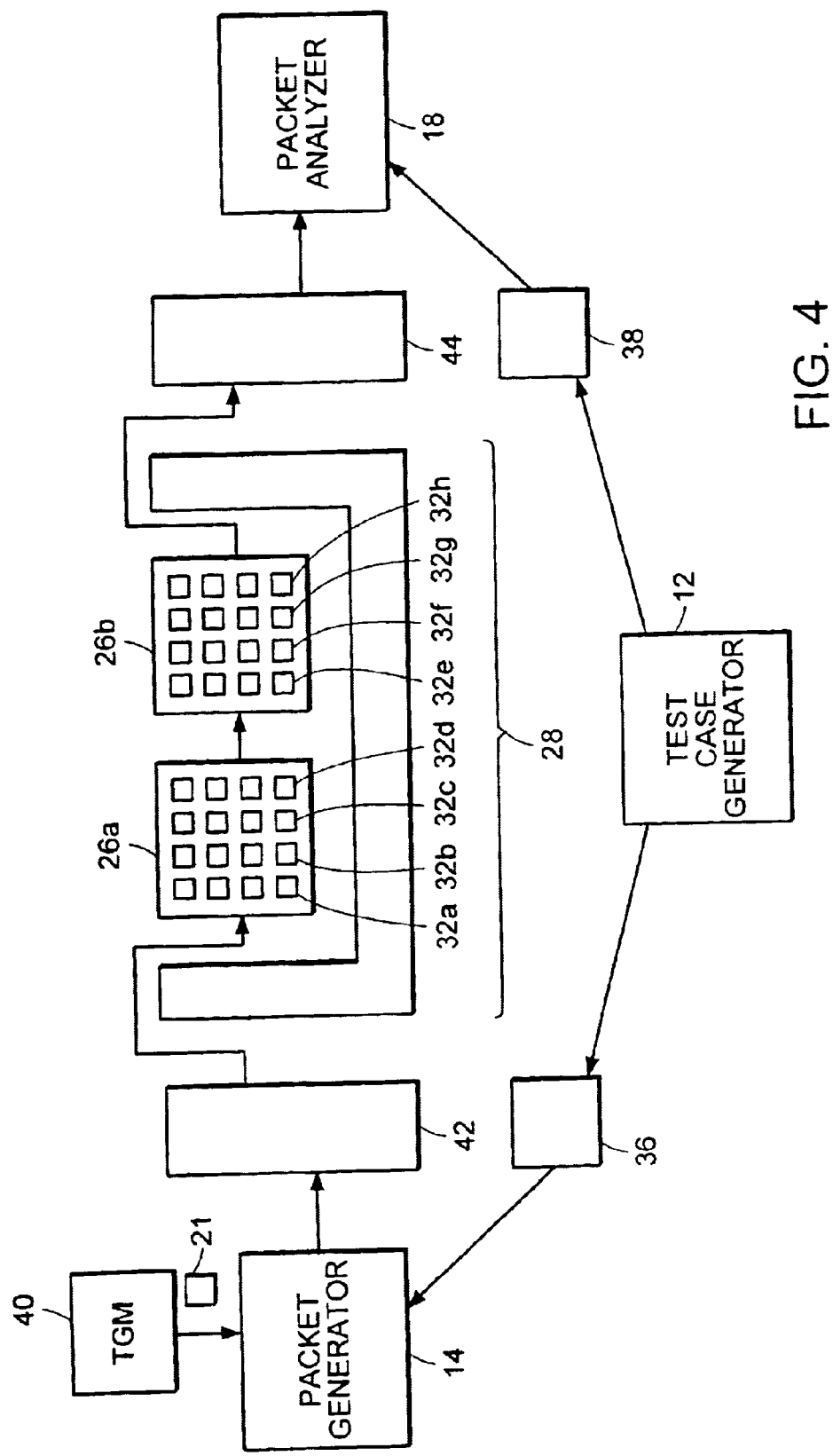
FIG. 4 shows a block diagram of the automated test case generation system of FIG. 3 in greater detail.

FIG. 4 shows the test bed of FIG. 3 with the test case generator 12. Referring to FIGS. 3 and 4, the test case generator 12 generates an input case list 36 and an output case list 38. The packet generator 14, by modifying a router packet from the TGM 40, generates a router test packet 30 (FIG. 3) and stores the packet 30 in the input packet file 42. For each router test packet 30 in the input packet file 42, a corresponding entry in the output case list 38 is generated by the test case generator 12. Following testing, an output packet file 44 contains a test results packet corresponding to each router test packet 30 from the input packet file 42. The packet analyzer 18 receives and compares the test verification packet generated from the output case list 38 with the test results packet from the output packet file 44 to determine the test outcome.

Figure 5:
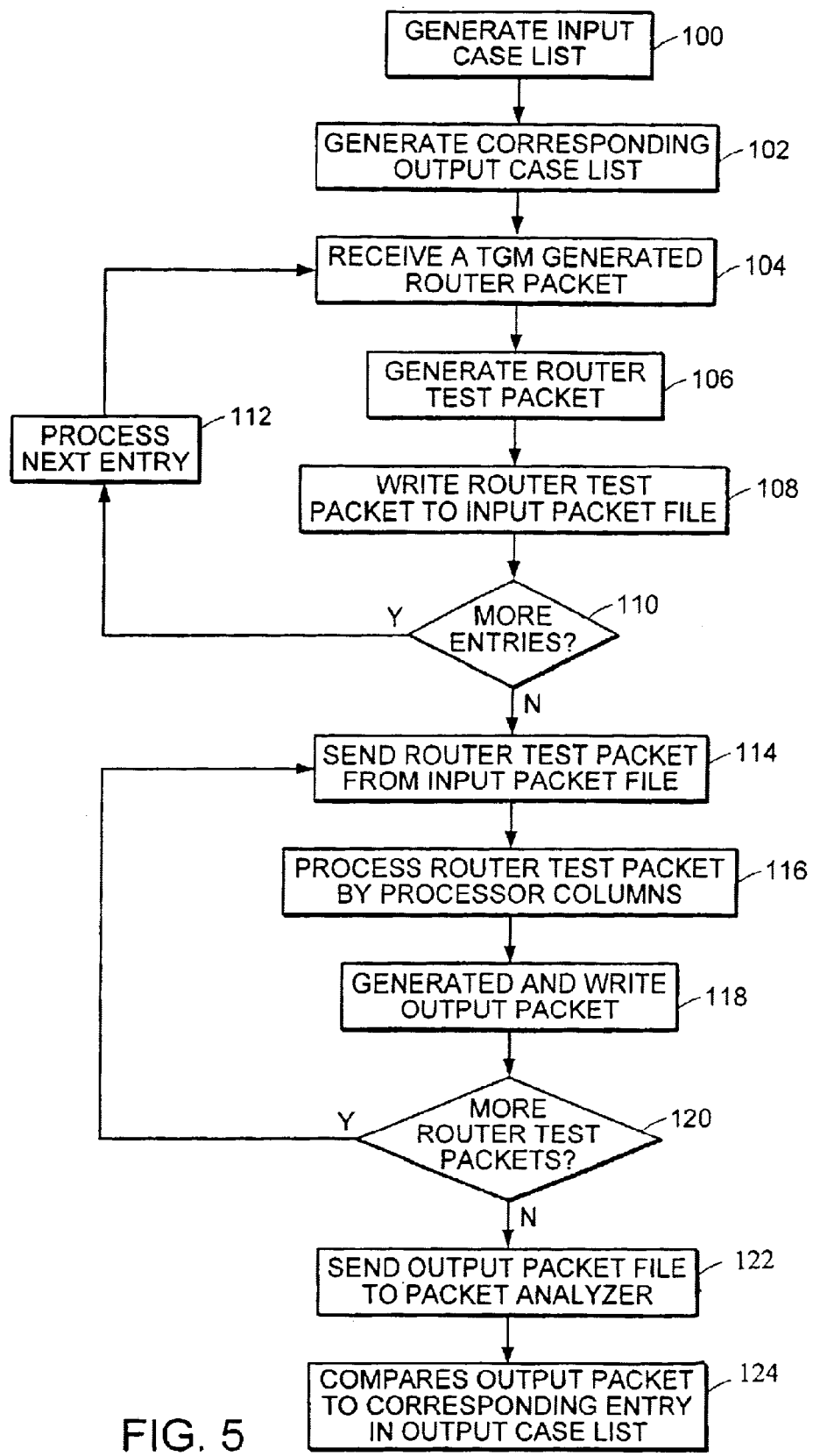
FIG. 5 show a flowchart of packet-based testing using the automated test case generation system.

FIG. 5 depicts a flowchart of packet-based testing as described herein. Referring to FIGS. 3, 4, and 5, an input case list is generated through the test case generator, as shown at step 100. A corresponding output case list 38 is generated, as depicted at step 102. For each entry in the input case list 36, the packet generator 14 receives a TGM generated router packet 21 as disclosed at step 104, and generates a router test packet 30 based on the input case list entry 36, as shown at step 106. The router test packet 30 is written to the input packet file 42, as depicted at step 108, and a check is made for more entries in the input case list 36, as shown at step 110. If there are more entries in the input case list 36, control reverts to step 104 to process the next entry, as shown at step 112. If all entries in the input case list 36 have been processed, the input packet file 42 is complete and is sent, packet by packet, to the test bed 28, as shown at step 114. Each router test packet 30 in the input packet file is processed by each of the processor columns 32a–32h in the processor banks 26a and 26b, as depicted at step 116. Following processing by the processor columns 26a and 26b, the output packet 34 is generated and is written to the output packet file 34, as disclosed at step 118. A check is made at step 120 to determine if there are more router test packets 30 in the input packet file 42. If there are more router test packets 30, control reverts to step 114. If all of the router test packets 30 have been processed, the output packet file 44 is sent to the packet analyzer 18, as depicted at step 122. For each output packet 34 in the output packet file 44, the packet analyzer generates a test verification packet from the corresponding entry in the output case list 38 and compares the test verification packet to the output packet 34, as depicted at step 124. In this manner, automatic generation of router test packets 30 for testing specific functions in the processor banks 26a and 26b avoids manual generation and validation for each test case.

TABLE I

| | |
|---|---|
| LC1 | 0030.965A.933A |
| LC2 | 0030.965A.933B |
| LC3 | 0030.965A.933C |
| LC4 | 0030.965A.933D |
| LC5 | 0030.965A.933E |
| LC6 | 0030.965A.933F |

Figure 6:
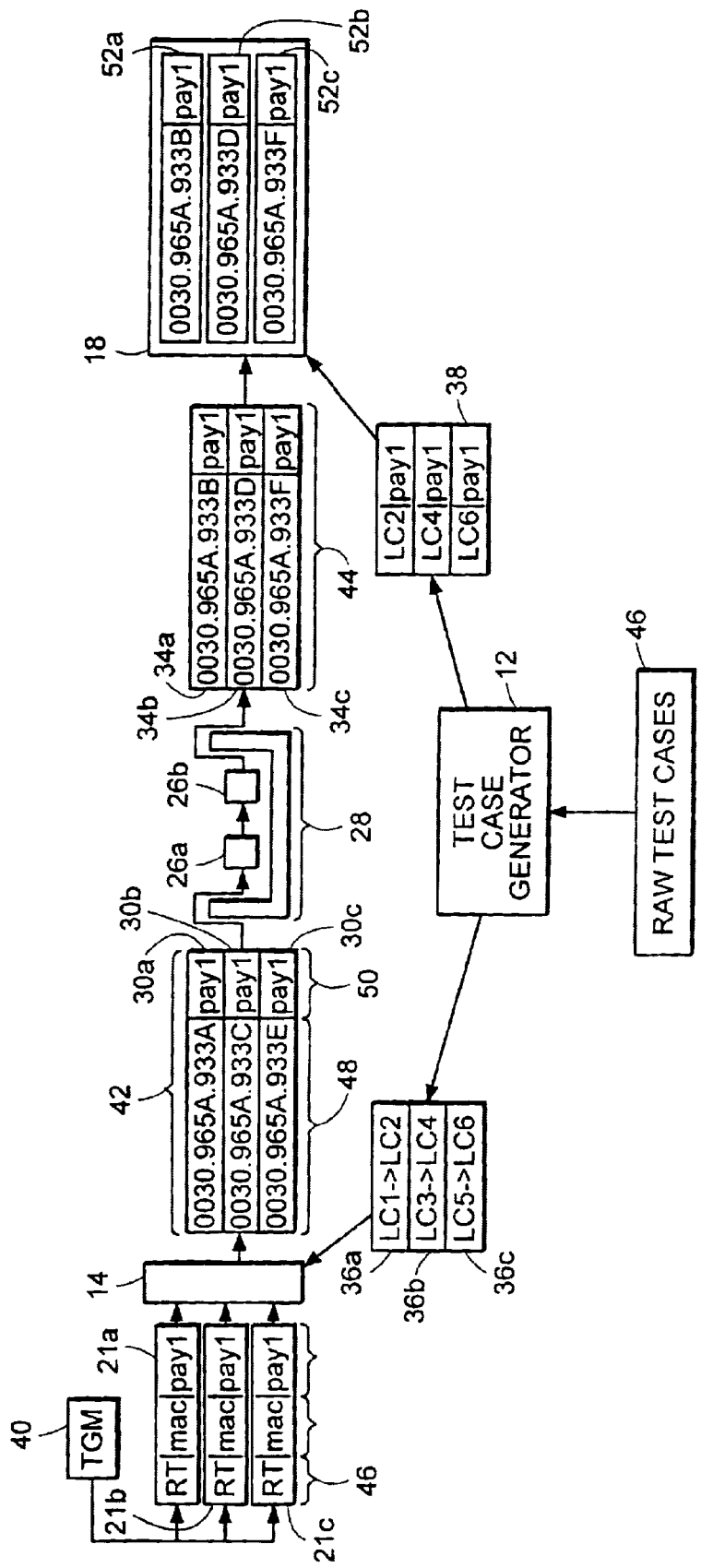
FIG. 6 shows an example of a packet-based test scenario using the system of FIG. 4.

FIG. 6 shows an example of a test case using the test case generator. Three test cases are developed to route a packet from line card one (LC1) to line card two (LC2), from line card three (LC3) to line card four (LC4), and from line card five (LC5) to line card six (LC6), respectively. Note that the substance of the raw test cases 46 developed may be from a variety of sources, such as from a unit test plan, engineering notes, iterations through a range of possible values, boundary values, quality control requirements, and others. The test case generator produces the input case list 36 and the corresponding output case list 38. The test case illustrated uses the supporting test data from TABLE I associating MAC address data with line cards.

The supporting test data is used by the packet generator 14 and by the packet analyzer 18 to derive the raw data to be written to each router test packet 30 generally and expected by each test results packet 34 generally. The input case list entries 36a–36c are supplied to the packet generator 14. The packet generator 14 receives the router packets 21a–21c from the TGM 40, and strips off the router fields 46. The router fields 46 correspond to processing performed by the router processor 24 (FIG. 2). MAC address fields and payload fields, 48 and 50 respectively, are left intact by the packet generator to produce the input packet file 42, including the router test packets 30a–30c. The router test packets 30a–30c are now indicative of a router packet following processing by the router processor 24 (FIG. 2), but prior to processing by the processor banks 26a and 26b.

The router test packets 30a–30b are supplied, in order, from the input packet file 42 to the processor banks 26a and 26b. Following processing by the processor banks 26a and 26b, the test results packets 34a–34c, corresponding respectively to the router test packets 30a–30c, are written to the output packet file 44.

The packet analyzer receives the output case list 38 from the test case generator, and, also using the supporting MAC address test data from TABLE I, generates a test verification packet 52a–52c for each of the test cases to compare to each of the test results packets 34a–34c. Test success is indicated by a match between the test results packet 34 and the test verification packet 52.

The examples of FIGS. 3–6 employ a plurality of processor banks corresponding to ASIC processors having microcode, and is intended as illustrative of the automated test packet generation engine as described and claimed herein. The unit under test need not be an ASIC processor bank, but could be a variety of hardware, software, or firmware units under test. The system and methods described in the particular embodiments disclosed are directed to automated generic packet-based testing by generating a packet directed to a specific traffic processing operation performed by a unit under test, without encumbering the test with extraneous operations which may otherwise need to be anticipated in a black-box testing environment. The testing system and methods described herein, therefore, target a discrete operation which may be performed in a series of operations in an actual system, and is directed to generating router test packets and test results packets adapted to be readily compared to ascertain test success or failure. Other packet-based systems can be tested using the methods described herein, such as other routing chips, processors, and protocols, and various hardware, software, and firmware included therein.

Those skilled in the art should readily appreciate that the programs defining the operations and methods defined herein are both deliverable to the test case generation system and directed to a unit under test encompassing many forms, including but not limited to a) information permanently stored on non-writeable storage media such as ROM devices, b) information alterable stored on writeable storage media such as floppy disks, magnetic tapes, CDs, RAM devices, and other magnetic and optical media, or c) information conveyed to a computer through communication media, for example using baseband signaling or broadband signaling techniques, as in an electronic network such as the Internet or telephone modem lines. The operations and methods may be implemented in a software executable out of a memory by a processor or as a set of instructions embedded in a carrier wave. Alternatively, the operations and methods may be embodied in whole or in part using hardware components, such as Application Specific Integrated Circuits (ASICs), state machines, controllers or other hardware components or devices, or a combination of hardware and software components, or hardware, software, or firmware simulators.

While the system and method for automated, generic packet-based test case generation and verification have been particularly shown and described with references to embodiments thereof, it will be understood by those skilled in the art that various changes in form and details may be made therein without departing from the scope of the invention encompassed by the appended claims. Accordingly, the present invention is not intended to be limited except by the following claims.

What is claimed is:

1. A method of automating packet-based testing of a routing chip in a routing engine comprising:

determining a set of traffic routing instructions indicative of traffic processing operations to be performed on a router packet by the routing engine;

selecting a set of test instructions corresponding to at least one of the traffic processing operations to be tested;

determining a preliminary subset of processing operations corresponding to the traffic routing instructions to be performed by the routing engine prior to the traffic processing operations to be tested;

generating a router test packet indicative of a state of the router packet after applying the preliminary subset of processing operations;

generating a test verification packet indicative of the router test packet after applying the traffic processing operations to be tested; and applying the set of test instructions to the router test packet.

2. The method of claim 1 further comprising building an input packet file and an output packet file, wherein the input packet file and output packet file store a plurality of corresponding pairs of router test packets and test results packets respectively.

3. The method of claim 1 further comprising the steps of:

building a test results packet as a result of applying the set of test instructions to the router test packet; and comparing the test results packet to the test verification packet.

4. The method of claim 3 wherein generating the router test packet further comprises:

generating the router packet; and applying the preliminary subset of processing operations to the router packet to yield the router test packet.

5. The method of claim 4 wherein generating the router packet further comprises generating according to a predetermined protocol.

6. The method of claim 5 wherein generating the router test packet further comprises modifying the router packet based on the predetermined protocol used to generate the router packet.

7. The method of claim 6 wherein modifying the router packet further comprises modifying corresponding to the preliminary subset of processing operations.

8. The method of claim 7 wherein the predetermined protocol is TCP/IP.

9. The method of claim 1 wherein the preliminary subsets of processing operations correspond to a predetermined protocol and the set of test instructions correspond to microcode instructions.

10. The method of claim 9 wherein the routing chip is an Application Specific Integrated Circuit (ASIC).

11. The method of claim 10 wherein the set of test instructions is directed to a routing chip comprising a predetermined group of processors in the routing engine.

12. The method of claim 11 wherein the predetermined group of processors corresponds to a subset of a 4 by 8 array of processors.

13. The method of claim 12 wherein the 4 by 8 array further comprises two 4 by 4 arrays of processors.

14. The method of claim 13 wherein the 4 by 8 array of processors corresponds to eight columns, wherein each of the columns corresponds to one of the predetermined group of processors.

15. The method of claim 14 wherein the predetermined group of processors comprises an Application Specific Integrated Circuit (ASIC).

16. A system for automated testing of a routing chip comprising:
  a set of traffic routing instructions indicative of traffic processing operations applied to a router packet by a routing engine;
  a test bed operable to apply a set of test instructions corresponding to a subset of the traffic routing instructions performed by routing engine; and
  a test case generator operable to generate test cases corresponding to a router test packet and a test verification packet, wherein the router test packet is indicative of applying a preliminary subset of processing operations to the router packet, the preliminary subset of processing operations corresponding to the traffic routing instructions applied prior to the traffic routing instructions which correspond to the set of test instructions, and wherein the test verification packet is indicative of applying the set of test instructions to the router test packet.

17. The system of claim 16 further comprising a packet analyzer operable to generate and compare the test verification packet to a test results packet indicative of the application of the set of test instructions to the router test packet by the test bed.

18. The system of claim 17 further comprising a packet generator operable to generate a router packet indicative of network message traffic.

19. The system of claim 18 wherein the packet generator is further operable to generate the router test packet from the router packet.

20. The system of claim 19 further comprising a raw test case script file indicative of at least one of the traffic processing operations, wherein the test case generator is further operable to read the script file and generate the test cases corresponding to the router test packet as a result of reading the script file.

21. The system of claim 20 wherein the packet analyzer is further operable to generate the test verification packet based on the router test packet and the script file.

22. The system of claim 21 wherein the packet analyzer is in communication with the test case generator and is further operable to generate the test verification packet from the test case sent by the test case generator.

23. The system of claim 22 wherein the packet generator is further operable to generate the router test packet by modifying the router packet based on a predetermined protocol used to generate the router packet.

24. The system of claim 23 wherein modifying the router packet corresponds to the preliminary subset of processing operations.

25. The method of claim 16 wherein the test bed corresponds to a plurality of processors in the routing engine and the set of test instructions are directed to a predetermined group of the plurality of processors.

26. The system of claim 25 wherein the plurality of processors corresponds to a 4 by 8 array of processors.

27. The system of claim 26 wherein the 4 by 8 array corresponds to eight columns, wherein each of the columns comprises one of the predetermined group of processors.

28. The system of claim 27 wherein the predetermined group of processors comprises an Application Specific Integrated Circuit (ASIC).

29. The system of claim 16 wherein the test bed comprises elements selected from the group consisting of a routing chip, microcode, a simulator, a hardware simulator, an ASIC simulator, and an ASIC.

30. The system of claim 23 wherein the predetermined protocol is TCP/IP.

31. A computer program product having computer program code for automating packet-based testing of a routing chip in a routing engine comprising:
  computer program code for determining a set of traffic routing instructions indicative of traffic processing operations to be performed on a router packet by the routing engine;
  computer program code for selecting a set of test instructions corresponding to at least one of the traffic processing operations to be tested;
  computer program code for determining a preliminary subset of processing operations corresponding to the traffic routing instructions to be performed by the routing engine prior to the traffic processing operations to be tested;
  computer program code for generating a router test packet indicative of a state of the router packet after applying the preliminary subset of processing operations;
  computer program code for generating a test verification packet indicative of the router test packet after applying the traffic processing operations to be tested; and
  computer program code for applying the set of test instructions to the router test packet.

32. A computer data signal embodied in a carrier wave for automating packet-based testing of a routing chip in a routing engine comprising:
  program code for determining a set of traffic routing instructions indicative of traffic processing operations to be performed on a router packet by the routing engine;
  program code for selecting a set of test instructions corresponding to at least one of the traffic processing operations to be tested;
  program code for determining a preliminary subset of processing operations corresponding to the traffic routing instructions to be performed by the routing engine prior to the traffic processing operations to be tested;
  program code for generating a router test packet indicative of a state of the router packet after applying the preliminary subset of processing operations;
  program code for generating a test verification packet indicative of the router test packet after applying the traffic processing operations to be tested; and program code for applying the set of test instructions to the router test packet.

33. A system for automated testing of a routing chip in a routing engine comprising:

means for determining a set of traffic routing instructions indicative of traffic processing operations to be performed on a router packet by the routing engine;

means for selecting a set of test instructions corresponding to at least one of the traffic processing operations to be tested;

means for determining a preliminary subset of processing operations corresponding to the traffic routing instructions to be performed by the routing engine prior to the traffic processing operations to be tested;

means for generating a router test packet indicative of a state of the router packet after applying the preliminary subset of processing operations;

means for generating a test verification packet indicative of the router test packet after applying the traffic processing operations to be tested; and means for applying the set of test instructions to the router test packet.

* * * * *